(12) United States Patent
Yu et al.

(10) Patent No.: US 12,183,726 B2
(45) Date of Patent: Dec. 31, 2024

(54) DISPLAY PANEL INCLUDING BANK STRUCTURES

(71) Applicant: Shanghai Tianma Micro-Electronics Co., Ltd., Shanghai (CN)

(72) Inventors: Quanpeng Yu, Shanghai (CN); Xuelin Fan, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 626 days.

(21) Appl. No.: 17/476,489

(22) Filed: Sep. 16, 2021

(65) Prior Publication Data

US 2022/0028845 A1   Jan. 27, 2022

(30) Foreign Application Priority Data

May 31, 2021  (CN) .................. 202110604990.X

(51) Int. Cl.
| | | |
|---|---|---|
| *H01L 25/16* | (2023.01) | |
| *G03F 7/00* | (2006.01) | |
| *H01L 27/12* | (2006.01) | |

(52) U.S. Cl.
CPC .......... *H01L 25/167* (2013.01); *G03F 7/0007* (2013.01); *H01L 25/165* (2013.01); *H01L 27/1288* (2013.01)

(58) Field of Classification Search
CPC . H01L 25/167; H01L 25/165; H01L 27/1288; G03F 7/0007

USPC .......................................................... 257/88
See application file for complete search history.

(56) References Cited

U.S. PATENT DOCUMENTS

| | | | | |
|---|---|---|---|---|
| 8,436,338 | B2* | 5/2013 | Gregory ............... | H10K 59/122 257/89 |
| 2010/0320482 | A1* | 12/2010 | Tachibana .............. | H05K 3/284 257/E33.059 |
| 2015/0188082 | A1* | 7/2015 | Rohatgi ................. | H10K 59/00 257/40 |

FOREIGN PATENT DOCUMENTS

| | | |
|---|---|---|
| CN | 107290901 A | 10/2017 |
| CN | 109004106 A | 12/2018 |
| CN | 112259006 A | 1/2021 |

* cited by examiner

*Primary Examiner* — Quoc D Hoang
(74) *Attorney, Agent, or Firm* — KILPATRICK TOWNSEND & STOCKTON LLP

(57) ABSTRACT

Provided are a display panel and a manufacturing method thereof. The display panel includes: a first substrate and a second substrate disposed opposite to each other; a bank layer located on a side of the first substrate facing the second substrate; and a light-emitting device. The bank layer includes a plurality of bank structures; and the plurality of bank structures enclose a plurality of bank openings. The light-emitting device is arranged corresponding to each bank opening of the plurality of bank openings. The plurality of bank structures includes at least one first bank structure, and each of the at least one first bank structure has a first channel communicating at least two adjacent ones of the plurality of bank openings.

15 Claims, 8 Drawing Sheets

DISPLAY PANEL INCLUDING BANK STRUCTURES

CROSS-REFERENCE TO RELATED APPLICATION(S)

This application claims priority to Chinese patent application No. 202110604990.X filed May 31, 2021, the disclosure of which is incorporated herein by reference in its entirety.

FIELD

Embodiments of the present disclosure relate to the field of display panel technologies and, in particular, to a display panel and a manufacturing method thereof.

BACKGROUND

With the progress and development of science and technology and the improvement of people's standard of living, the display panel has been deeply used in various electronic products. Hence the display panels are manufactured in large quantity, and people have higher and higher requirements for the performance of the display panels.

How to improve the quality of display panel has become an urgent problem to be solved in the present manufacturing process of the display panel.

SUMMARY

Embodiments of the present disclosure provide a display panel and a manufacturing method thereof to improve the display effect of the display panel.

Embodiments of the present disclosure provide a display panel. The display panel includes: a first substrate and a second substrate disposed opposite to each other; and a bank layer located on a side of the first substrate facing the second substrate, where the bank layer includes a plurality of bank structures; the plurality of bank structures encloses a plurality of bank openings; and a plurality of light-emitting devices, each light-emitting device is arranged corresponding to each bank opening of the plurality of bank openings.

The plurality of bank structures includes at least one first bank structure, and each of the at least one first bank structure has a first channel communicating at least two adjacent ones of the plurality of bank openings.

Based on the same concept, embodiments of the present disclosure further provide a manufacturing method of a display panel.

The manufacturing method includes steps described below.

One first substrate is provided.

A material layer for forming a bank film layer on a side of the first substrate is formed and the material layer is patterned to form a bank layer. The bank layer includes a plurality of bank structures, the plurality of bank structures encloses a plurality of bank openings, the plurality of bank structures includes at least one first bank structure, and each first bank structure of the at least one the first bank structure is provided with a first channel communicating at least two adjacent ones of the plurality of bank openings.

In the embodiments of the present disclosure, the bank layer located on a side of the first substrate facing the second substrate includes a plurality of bank structures. The plurality of bank structures includes at least one first bank structure, and each first bank structure of the at least one the first bank structure is provided with a first channel communicating at least two adjacent ones of the plurality of bank openings, and the first channel can discharge impurities or bubbles in the bank openings, reducing the influence of the impurities or bubbles on the light emitted by the light-emitting devices and improving the display effect of the display panel.

BRIEF DESCRIPTION OF DRAWINGS

In order for the embodiments of the present disclosure to be described more clearly, drawings to be used in the description of the embodiments or the related art are briefly described hereinafter. Apparently, while the drawings in the description are some embodiments of the present disclosure, these drawings may be expanded and extended to other structures and drawings according to the basic concepts of the device structure, driving method, and manufacturing method disclosed and indicated in embodiments of the present disclosure. These are undoubtedly all within the scope of the claims of the present disclosure.

DETAILED DESCRIPTION

In order for embodiments of the present disclosure to be clearer, the embodiments of the present disclosure are described more clearly and completely hereinafter with reference to drawings of embodiments of the present disclosure and in conjunction with implementations. Apparently, the embodiments described herein are some embodiments, not all embodiments, of the present disclosure.

The inventors find that some impurities such as bubbles may be left over in the display region during the present manufacturing process of the display panel. Such impurities may block the light emitted by the light-emitting devices or influence the propagation path of the light emitted by the light-emitting devices, resulting in poor display effect of the display panel.

Figure 1:
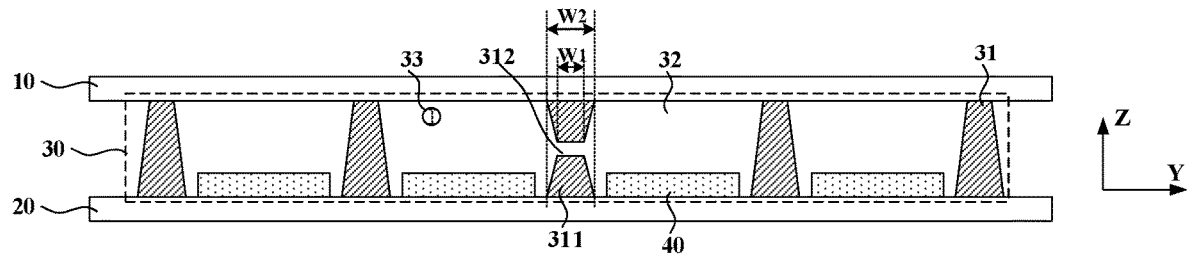
FIG. 1 is a schematic diagram of a display panel provided by an embodiment of the present disclosure.
Figure 2:
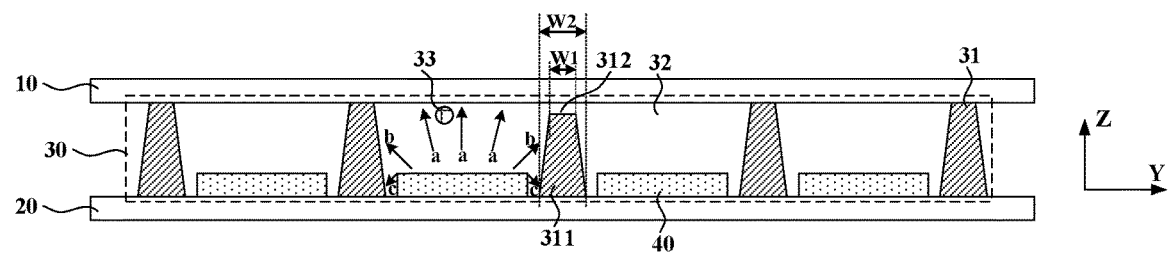
FIG. 2 is a schematic diagram of another display panel provided by an embodiment of the present disclosure.
Figure 3:
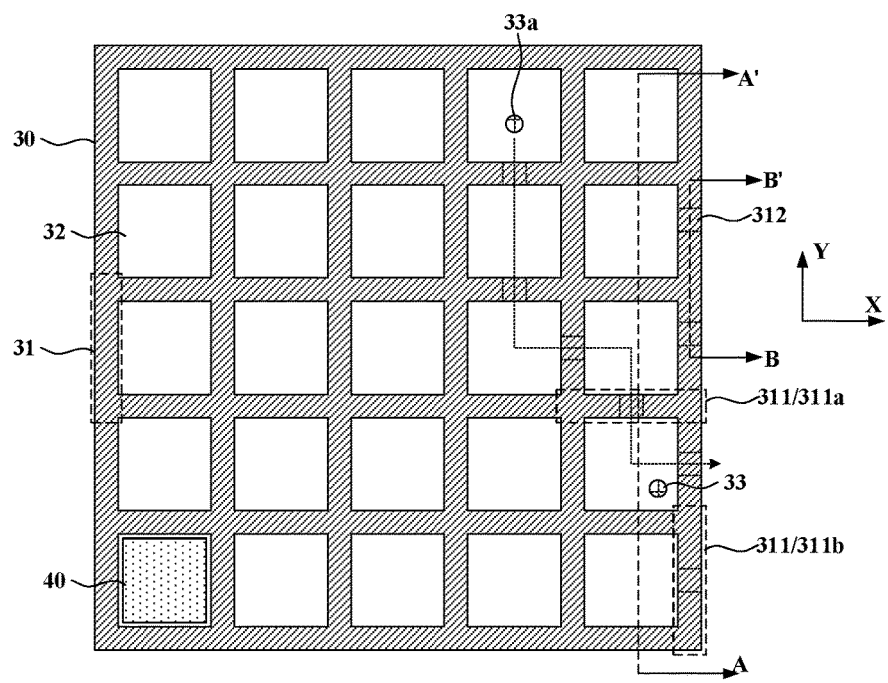
FIG. 3 is a top view of a bank layer in a display panel provided by an embodiment of the present disclosure.

To solve the preceding problem, the embodiments of the present disclosure provide a display panel. Referring to FIG. 1, FIG. 1 is a schematic diagram of a display panel provided by an embodiment of the present disclosure. Referring to FIG. 2, FIG. 2 is a schematic diagram of another display panel provided by an embodiment of the present disclosure. Referring to FIG. 3, FIG. 3 is a top view of a bank layer in a display panel provided by an embodiment of the present disclosure. As shown in the figure, the display panel provided in this embodiment includes: a first substrate 10 and a second substrate 20 disposed opposite to each other; and a bank layer 30 located on a side of the first substrate 10 facing the second substrate 20, where the bank layer 30 includes a plurality of bank structures 31; and the plurality of bank structures 31 enclose a plurality of bank openings 32; and a light-emitting device 40, which is arranged corresponding to the bank opening 32; where the plurality of bank structures 31 includes at least one first bank structure 311, and each of the at least one first bank structure 311 has a first channel 312 communicating at least two adjacent ones of the plurality of bank openings 32. It can be understood that a sectional structure of the bank layer 30 taken along A-A' in FIG. 3 is the bank layer 30 as shown in FIG. 1 or 2.

In an embodiment, the display panel includes a first substrate 10 and a second substrate 20 disposed opposite to each other. In an embodiment, the first substrate 10 is a color filter substrate and the second substrate 20 is an array substrate. It can be understood that the array substrate includes a substrate, and an array metal layer and an interlayer insulating layer arranged on the substrate. The array metal layer includes at least a gate metal layer and a source-drain metal layer, constituting a pixel driving circuit array including devices such as a transistor, etc. The pixel driving circuit array includes a plurality of pixel driving circuits for driving corresponding light-emitting devices 40 to emit light. The color film substrate includes a transparent substrate and a structure such as a color resistance arranged on the transparent substrate, etc. In an embodiment, the display panel may be a hard display panel or a flexible display panel. In an embodiment, the display panel may also be a micro light-emitting diode display panel or a quantum-dot display panel, but the display panel in the embodiments of the present disclosure is not limited to this type.

Figure 4:
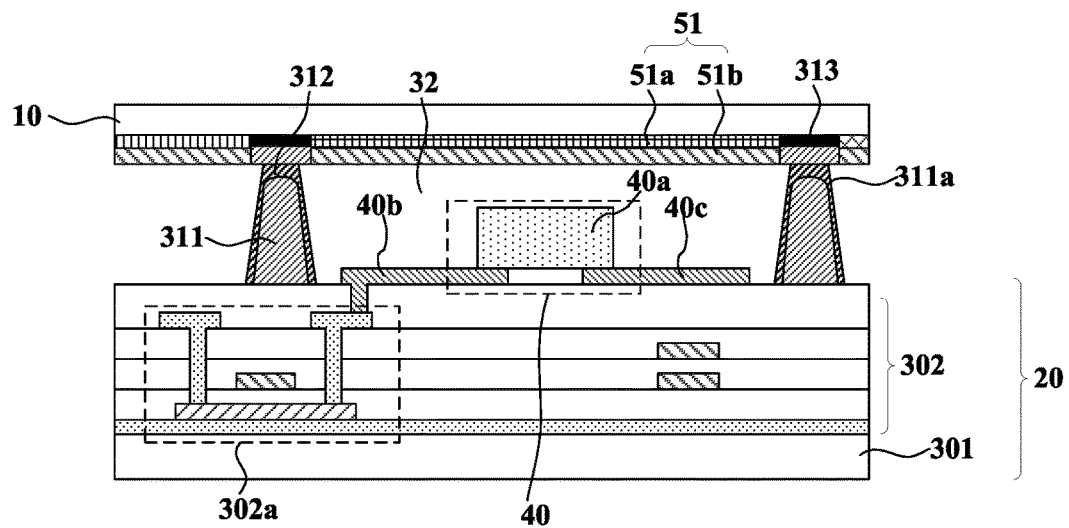
FIG. 4 is a schematic diagram of another display panel provided by an embodiment of the present disclosure.

Referring to FIG. 4, FIG. 4 is a schematic diagram of another display panel provided by an embodiment of the present disclosure. As shown in FIG. 4, in an embodiment, a second substrate 20 includes a substrate 301 and an array layer 302 which are sequentially stacked, and the second substrate 20 is provided with a light-emitting device layer. The substrate 301 is a flexible substrate or a rigid substrate. The array layer 302 includes an array metal layer and an interlayer insulating layer. The array layer 302 includes at least a gate metal layer and a source-drain metal layer. The gate metal layer and the source-drain metal layer constitute a pixel driving circuit array including a structure such as a thin film transistor, etc. The pixel driving circuit array includes a plurality of pixel driving circuits 302. The light-emitting device layer includes a plurality of light-emitting devices 40. The plurality of light-emitting devices 40 have one or more colors, and one light-emitting device 40 of the light-emitting device layer corresponds to and is electrically connected to one pixel driving circuit 302a of the array layer 302. The pixel driving circuit 302a drives the light-emitting device 40 to emit light.

In an embodiment, the light-emitting device 40 includes a micro light-emitting diode 40a, a first light-emitting electrode 40b and a second light-emitting electrode 40c. The first light-emitting electrode 40b and the second light-emitting electrode 40c are arranged at intervals and insulated from each other, and are in contact with the micro light-emitting diode 40a separately. The light-emitting principle of the light-emitting device 40 is that an electrical signal is applied to the first light-emitting electrode 40b and the second light-emitting electrode 40c, so that the micro light-emitting diode 40a is powered on to emit light. In an embodiment, the first light-emitting electrode 40b and the second light-emitting electrode 40c are located on a same side of the micro light-emitting diode 40a. In other embodiments, the first light-emitting electrode and the second light-emitting electrode are located on different sides of the micro light-emitting diode.

The bank layer 30 is located on a side of a first substrate 10 facing the second substrate 20. A bank structure 31 is located between two adjacent ones of the plurality of light-emitting devices 40, in an embodiment, the bank layer 30 is located on a side of the first substrate 10 facing the second substrate 20, and the bank layer 30 is in contact with an insulating layer on the second substrate 20, and the light-emitting device 40 is arranged corresponding to the bank opening 32. It is to be noted that FIG. 4 merely exemplarily illustrates structures of various film layers in an area where one light-emitting device 40 is located.

The bank layer 30 includes a plurality of bank structures 31, the plurality of bank structures 31 enclose a plurality of bank openings 32, the light-emitting device 40 is arranged corresponding to the bank opening 32, and the bank structures 31 are arranged surrounding the light-emitting device 40 so that light-emitting electrodes of two adjacent light-emitting devices 40 are insulated from each other and light of the micro light-emitting diode 40a of the two adjacent light-emitting devices 40 may also be shielded. Multiple bank structures 31 of the bank layer 30 communicate with each other, and a plurality of areas formed by the plurality of bank structures 31 are a plurality of bank openings 32. For example, a shape of the bank opening 32 is a quadrangle, and a quadrilateral area enclosed by connecting four bank structures 31 from head to tail is one bank opening 32. In a direction perpendicular to the first substrate 10, the light-emitting device 40 is arranged corresponding to the bank opening 32. It is understood that a position of the light-emitting device 40 is set through the bank opening 32. In an embodiment, the light-emitting device 40 is arranged within the bank opening 32.

As shown in FIG. 4, in an embodiment, one end of a first bank structure 311 facing the first substrate 10 is provided with a first channel 312. The first substrate 10 includes a black matrix 313, and a first functional module 51 is provided within an opening of the black matrix 313. In an embodiment, most of light emitted from the light-emitting device 40 is emitted to the first substrate 10, and a small part of light with a relatively small emitted angle may be emitted into the first channel 312. Since the light emitted to the first channel 312 has a relatively small emitted angle, it is difficult for the light to be obliquely emitted to the adjacent bank opening 32 through the first channel 312, and correspondingly, the light cannot enter the adjacent first functional module 51.

That the first functional layer 51 includes a color resistance 51a and a quantization layer 51b is used as an example. The light emitted by the light-emitting device 40 can barely be incident into the adjacent bank opening 32 through the first channel 312. Therefore, the first channel 312 is provided in the bank layer 30 so that the discharge of bubbles or impurities in the bank opening 32 can be implemented without causing light leakage of the light-emitting device 40 and the phenomenon that the light-emitting device 40 excites the adjacent quantization layer 51b also does not occur.

In a direction parallel to the first substrate 10, a plurality of bank structures 31 are arranged surrounding a periphery of one light-emitting device 40. Adjacent light-emitting devices 40 are isolated by using the bank structure 31. The bank structure 31 can block external dust or water vapor from eroding the light-emitting devices 40. In addition, the light emitted from the light-emitting device 40 is emitted to the first substrate 10 or the second substrate 20, and the light may also be emitted to other directions, thus the bank structure 31 may also block the light emitted from the light-emitting device 40 to positions where other light-emitting devices are located to prevent crosstalk of the adjacent light-emitting devices 40 caused by the light leakage of the light-emitting device 40, improving the display effect of the display panel.

In an embodiment, as shown in FIG. 2, the light emitted from the light-emitting device 40 may be divided into three types: light a directly emitted to outside through the bank opening 32, light b emitted to the bank structure 31, and light c emitted downward. It can be understood that crosstalk does not occur between the light a directly emitted to the outside through the bank opening 32 and the adjacent light-emitting device 40. Most of the light b emitted to the bank structure 31 is blocked by the bank structure 31, and the risk of crosstalk with the adjacent light-emitting device 40 is relatively low. The light c emitted downward is blocked by the bank structure 31 or the lower substrate, and has a low risk of crosstalk with the adjacent light emitting device 40. Therefore, the bank structures 31 arranged surrounding the light-emitting device 40 can prevent the light leakage of the light-emitting device 40, reduce the risk of crosstalk with the adjacent light emitting device 40, and improve the display effect of the display panel.

It is to be noted that, a liquid optical clear adhesive (LOCA) is usually filled between the first substrate 10 and the second substrate 20. The LOCA is a special adhesive mainly used for bonding transparent optical elements. The LOCA is filled between the first substrate 10 and the second substrate 20, which can play a role in fixing the light-emitting device 40 and avoid affecting the display effect due to the displacement of the light-emitting device 40 under the shock of the external force. It can be understood that the bonding material filled between the first substrate 10 and the second substrate 20 and for fixing the light-emitting device 40 includes, but is not limited to, liquid optical transparent adhesive, and may also be other bonding materials suitable for the present disclosure, which is not specifically exemplified herein.

The liquid optical transparent adhesive for fixing the light-emitting device 40 is filled between the first substrate 10 and the second substrate 20. Bubbles 33 may exist in the liquid optical transparent adhesive after the filling. In this case, the bubbles 33 are located within the bank opening 32, which may affect the propagation of the light emitted from the light-emitting device 40 and further affect the display effect of the display panel. Based on this, in this embodiment, the bank structure 31 includes the first bank structure 311, the first bank structure 311 has a first channel 312 communicating at least two adjacent ones of the plurality of bank openings 32, and the bubbles 33 within the bank openings 32 can be discharged to other positions through the first channel 312 of the first bank structure 311, improving the display effect of the display panel. In an embodiment, the first bank structure 311 is in direct contact with the second substrate 20 and the first substrate 10. There is no other intervals or indirectly connected banks between the bank structure and the substrates. However, in other embodiments, the first bank structure is also in contact with the substrates through other intervals or indirectly connected banks.

Referring to FIG. 3, it merely shows the first channel 312 of two or more first bank structures 311, and as shown in FIG. 3, the bubbles 33a may be discharged from the bank layer 30 along the first channel 312 extending along a dash polyline. It can be understood that, FIGS. 1 to 3 merely show the first channel of a part of first bank structures. In fact, each bank opening may be communicated through the first channel, for example, if the bank openings in each column are communicated through the first channel, or the bank openings in each row are communicated through the first channel, or each first wall structure surrounding the bank opening has the first channel, the bubbles within the bank opening can be discharged to other positions or to the outside of the bank layer through the first channel. Relevant practitioners may reasonably design the first channel in the bank layer according to the product requirements.

It can be understood that other impurities may exist in the bank opening, and the first channel may also be used for discharging the impurities in the bank opening, improving the display effect of the display panel.

It is to be noted that the risk of crosstalk caused by the first channel 312 arranged in the first bank structure 311 is low. It can be understood that the first channel 312 is arranged in the first bank structure 311 and is mainly used for discharging the bubbles 33 in the bank opening 32. Generally, the size of the bubbles 33 is very small, so the first channel 312 in the first bank structure 311 can have a size allowing the bubbles 33 to pass through. If the light emitted from the light-emitting device 40, such as a part of the light b enters the first channel 312, most of the light cannot pass through the first channel 312, and only a very small number of the light may pass through the first channel 312 and enter the adjacent bank opening 32, which has very little crosstalk effect on the adjacent light-emitting device 40.

In addition, one first channel shown in FIG. 1 is located in a non-end area of the first bank structure, and one first channel shown in FIG. 2 is located at one end of the first bank structure facing the first substrate. In other embodiments, the first channel is also located in the middle of the first bank structure, or the first channel is arranged closer to one end of the first bank structure; and a position of the first channel of different first bank structures in the bank layer may be same or different. For example, in the bank layer, at least one first channel is located in the middle of the first bank structure, or at least one first channel is located at one end of the first bank structure. Relevant practitioners may reasonably design the position of the first channel in the bank layer according to the product requirements, which is not limited to the positions shown in the figures.

In an embodiment, in a direction Z perpendicular to the first substrate 10, a maximum size of the first channel 312 is less than or equal to ½ of a maximum size of the first bank structure 311. It can be understood that the first channel 312 is mainly used for discharging the impurities or bubbles within the bank opening 32. Therefore, the first channel 312 in the direction Z can have a size allowing the bubbles or impurities to be discharged. If the first channel 312 in the direction Z has a too large size, light leakage may occur and cause the crosstalk. Therefore, the maximum size of the first channel 312 in the direction Z is less than or equal to ½ of the maximum size of the first bank structure 311 so that the risk of crosstalk can be reduced. In an embodiment, the direction Z is a third direction and a plane where the first substrate 10 is located is an X-Y plane, the third direction Z is perpendicular to the plane where the first substrate 10 is located, that is, the direction Z is perpendicular to the X-Y plane.

It is to be noted that, in this embodiment or the cross-sectional views provided hereafter, the first bank structure 311 filled with oblique lines is a bank structure presented by a cross section at the first channel 312, and due to the existence of the first channel 312, there is a gap between the cross section of the first bank structure 311 and an opposite substrate, that is, the first channel 312. A bank 311a exposed at the position of the first channel 312 of the first bank structure 311 is substantially a cross-section schematic of the bank structure in a non-channel region. There is no channel between the bank structure in the non-channel region and the opposite substrate, thus in the figure, the bank structure 311a in the non-channel region is in contact with the opposite substrate. The bank structure in each non-channel region will not be specifically described herein.

In the embodiments of the present disclosure, the bank layer located on a side of the first substrate facing the second substrate includes a plurality of bank structures. Each bank structure includes the first bank structure. The first bank structure has the first channel communicating at least two adjacent ones of the plurality of bank openings, and the first channel can discharge impurities or bubbles in the bank openings, reducing the influence of the impurities or bubbles on the light emitted by the light-emitting devices and improving the display effect of the display panel.

Figure 5:
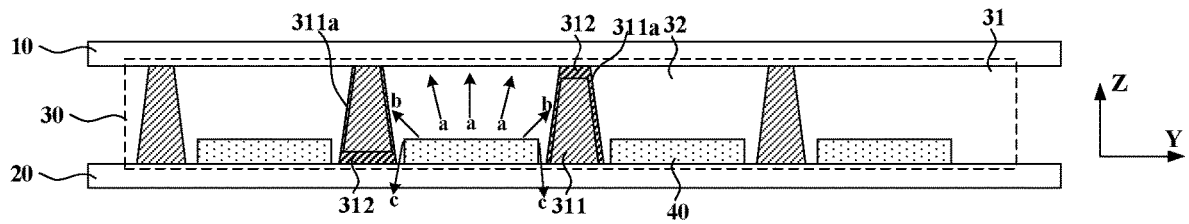
FIG. 5 is a schematic diagram of another display panel provided by an embodiment of the present disclosure.

In an embodiment, referring to FIG. 5, FIG. 5 is a schematic diagram of another display panel provided by the embodiment of the present disclosure. As shown in FIG. 5, a first channel 312 is located at least one end of a first bank structure 311 in a direction Z perpendicular to a first substrate 10. In this embodiment, the first channel 312 may be located at one end of the first bank structure 311 facing the first substrate 10 and the first channel 312 may also be located at one end of the first bank structure 311 facing the second substrate 20. Relevant practitioners may reasonably design the first channel in the bank layer according to the product requirements. In other embodiments, a part of the first channel is located in the middle of the first bank structure to communicate two adjacent bank openings.

In an embodiment, in the direction Z perpendicular to the first substrate 10, the first channel 312 is located at one end of the first bank structure 311 facing the first substrate 10. In an embodiment, the light-emitting device 40 is located on a side of the second substrate 20 facing the first substrate 10, and the first channel 312 is located at one end of the first bank structure 311 closer to the first substrate 10. In other embodiments, the light-emitting device is located on a side of the first substrate facing the second substrate, and the first channel is located at one end of the first bank structure closer to the second substrate.

That the light-emitting device 40 is located on a side of the second substrate 20 facing the first substrate 10 in FIG. 5 is used as an example. In a case where the first channel 312 is located at one end of the first bank structure 311 facing the second substrate 20, light c is emitted from the light-emitting device 40, and most of the light c is incident into the first bank structure 311 or the second substrate 20 and is blocked, and the remaining small part of the light is incident into the first channel 312. For the light incident into the first channel 312, most of the light cannot enter the adjacent bank opening 32, only a very few part of the light may enter the adjacent bank opening 32, such type of light entering the adjacent bank opening 32 through the first channel 312 may not be emitted from the adjacent bank opening 32 due to its emitted angle, thus the first channel 312 is located at one end of the first bank structure 311 facing the second substrate 20, so that the light shading effect of the first bank structure 311 cannot be affected, and the phenomenon of crosstalk with the adjacent light emitting device 40 barely occurs.

Similarly, in the case where the first channel 312 is located at one end of the first bank structure 311 facing the first substrate 10, most of the light b emitted from the light-emitting device 40 is incident into the first bank structure 311 and is blocked, and the remaining small part of the light is incident into the first channel 312. For the light incident into the first channel 312, the light barely enters the adjacent bank opening 32 due to its emitted angle, thus the first channel 312 is located at one end of the first bank structure 311 facing the first substrate 10, so that the light shielding effect of the first bank structure 311 cannot be affected, and the phenomenon of crosstalk with the adjacent light emitting device 40 barely occurs.

The principle of the light-emitting device being located on a side of the first substrate facing the second substrate is similar to the above analysis, and will not be described in detail herein.

As described above, the first channel 312 is located at least one end of the first bank structure 311 in the direction Z perpendicular to the first substrate 10, the position of the first channel 312 cannot affect the light shielding effect of the first bank structure 311, ensuring the light shielding effect of the first bank structure 311 and reducing the risk of the light leakage and crosstalk of the adjacent light emitting device 40. Meanwhile, impurities or bubbles in the bank opening 32 may be discharged through the first channel 312 in the first bank structure 311, improving the display effect of the display panel. In addition, the first channel 312 at one end of the first bank structure 311 facing the second substrate 20 shown in the figure may remove the bubbles or impurities at a level height close to the second substrate 20, and the first channel 312 at one end of the first bank structure 311 facing the first substrate 10 may remove the bubbles or impurities at a level height close to the first substrate 10. Apparently, the first channels 312 in the plurality of first bank structures 311 are arranged at different positions, which can discharge the bubbles or impurities at different level heights in the display panel.

Referring to FIGS. 1 and 2, in an embodiment, in the direction Z perpendicular to the first substrate 10, a width W1 of the first bank structure 311 at a position of the first channel is less than a width W2 of the first bank structure 311 not at the position of the first channel. Here, a size of a width direction of the first bank structure 311 is a width of the first bank structure 311, a width direction of the first bank structure 311 is parallel to an X-Y plane where the first substrate 10 is located, and the width direction of the first bank structure 311 is perpendicular to an extension direction of the first bank structure 311. It can be understood that the extension directions of the plurality of bank structures 31 in the bank layer 30 are not totally same, so the width directions of the plurality of bank structures 31 in the bank layer 30 are not totally same. As shown in FIG. 3, an extension direction of a first bank structure 311a is different from an extension direction of a first bank structure 311b, a width direction of the first bank structure 311a is different from a width direction of the first bank structure 311b. In an embodiment, the width direction of the first bank structure 311a is parallel to a Y direction, and the width direction of the first bank structure 311b is parallel to an X direction.

In this embodiment, the width W1 of the first bank structure 311 at the position of the first channel is less than the width W2 of the first bank structure 311 not at the position of the first channel, which facilitates manufacturing the first channel 312 at the position of the first channel of the first bank structure 311 during the manufacturing process.

Usually, a material for forming the bank structure 31 is a photoresist, and the bank layer 30 is patterned by using a photoetching process to form the bank opening 32 and the bank structure 31. When the bank layer 30 is patterned by the photoetching process, an under cut occurs at the position of the first channel of the first bank structure 311. Since the width W1 of the first bank structure 311 at the position of the first channel is small, the first channel 312 can be directly drilled and manufactured at the position of the first channel of the first bank structure 311 by the under cut. Therefore, the bank layer 30 can be patterned and the first channel 312 can be manufactured simultaneously by using one photoetching process. Compared with the existing art, the additional manufacturing process is not needed, reducing the process manufacturing difficulty.

In an embodiment, the material for forming the bank structure 31 is a negative photoresist, and a height size of the bank structure formed by the negative photoresist is relatively large in the direction Z. Generally, the height size of the bank structure formed by the negative photoresist is about 10 to 20 microns in the direction Z, while a height size of the bank structure formed by a positive photoresist is only 2 to 3 microns in the direction Z. Apparently, the first channel is suitable to be formed in the bank structure formed by the negative photoresist. Each embodiment in the present disclosure is described by using the negative photoresist as an example, but the embodiments of the present disclosure is not limited to the negative photoresist, and relevant practitioners may choose the positive photoresist as the bank material according to the product requirements For the bank structure made of the negative photoresist material, in an embodiment, the first channel is located at one end of the first bank structure away from an exposure end. It can be understood that after the bank structure is formed by using the negative photoresist material and exposed, a width of the first bank structure at the exposure end is greater than a width of the first bank structure at a non-exposure end. For example, one end of the first bank structure facing the second substrate is used as the exposure end, the first channel is located at one end of the first bank structure facing the first substrate, and after exposure, the width of one end of the first bank structure facing the second substrate is greater than the width of one end of the first bank structure facing the first substrate.

In an embodiment, the first bank structure 311 includes a first end and a second end in the direction Z perpendicular to the first substrate 10, the first channel 312 is located at the first end of the first bank structure 311. In the direction parallel to the first substrate 10, a width W1 of the first end of the first bank structure 311 is less than a width W2 of the second end of the first bank structure 311. Referring to FIG. 2, in an embodiment, the first end of the first bank structure 311 is one end of the first bank structure 311 facing the first substrate 10, and the first channel 312 is located at the first end of the first bank structure 311. On this basis, the width W1 of the first end of the first bank structure 311 is less than the width W2 of the second end of the first bank structure 311, which facilitates patterning the bank layer 30 by using the photoetching process. Meanwhile, the first channel 312 is drilled and manufactured at a position of the first end of the first bank structure 311, reducing the process manufacturing difficulty.

Figure 6:
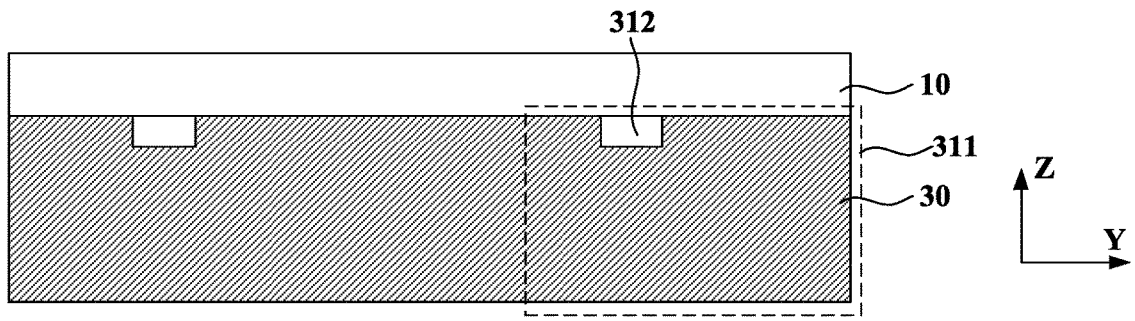
FIG. 6 is a cross-sectional view taken along the line B-B' of FIG. 3.

For any of the above embodiments, at least one end of the first bank structure is provided with a groove in the direction perpendicular to the first substrate, and a gap between a plane where a groove bottom of the groove is located and a plane where a groove opening of the groove is located forms the first channel. Referring to FIG. 6, FIG. 6 is a cross-sectional view taken along the line B-B' of FIG. 3. As shown in FIG. 6, the first channel 312 in the first bank structure 311 may be a groove formed at one end of the first bank structure 311, and impurities, bubbles or the like in the bank opening may be discharged to other areas through the groove. As shown in FIG. 6, the groove may be in a shape of a quadrangle, and in other embodiments, the groove may also be in a shape of a semicircle. The groove may be formed in the first bank structure 311 by using different processes, and the grooves may be in different shapes according to different manufacturing process, which is not specifically exemplified herein.

In this embodiment, the bank structure can effectively support the first substrate and the second substrate, and can also prevent the light leakage of the adjacent light emitting device. Meanwhile, the first channel on the first bank structure may also discharge the bubbles and impurities left over in the bank opening.

Figure 7:
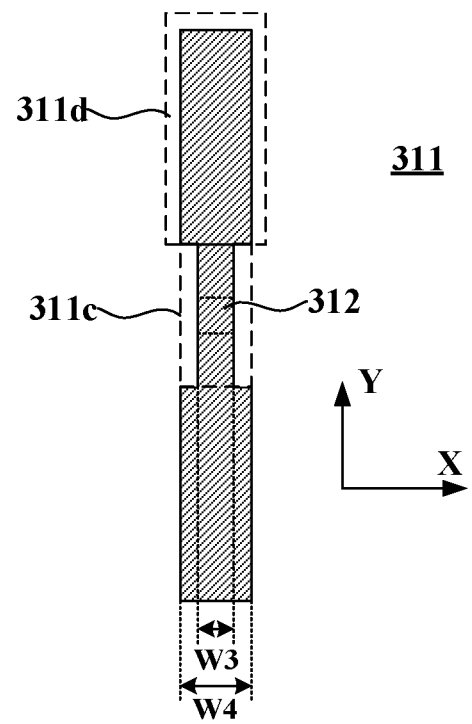
FIG. 7 is a schematic diagram of a first bank structure provided by an embodiment of the present disclosure.

Referring to FIG. 7, FIG. 7 is a schematic diagram of a first bank structure provided by an embodiment of the present disclosure. As shown in FIG. 7, in an embodiment, the first bank structure 311 includes a first region 311c and a second region 311d in a direction in which the first bank structure extends; and in the direction parallel to the first substrate, a width W3 of the first bank structure 311 in the first region 311c is less than a width W4 of the first bank structure 311 in the second region 311d, and the first channel 312 is located in the first region 311c. It can be understood that the plane where the first substrate is located is the X-Y plane, and the width direction of the first bank structure 311 is parallel to the X-Y plane and perpendicular to the extension direction of the bank structure. If the extension direction of the first bank structure 311 is parallel to the Y direction as shown in FIG. 7, the width direction of the first bank structure 311 is parallel to the X direction. In other embodiments, the extension directions of other first bank structures may also be parallel to the X direction. In some cases, the second region 311d described in this embodiment is equivalent to the non-channel region in some other embodiments of the present disclosure.

It is to be noted that the width W3 of the first bank structure 311 in the first region 311c and the width W4 of the first bank structure 311 in the second region 311d uniformly refer to a width of a projection of one end of the first bank structure 311 facing the first substrate 10 on the plane where the first substrate 10 is located.

In this embodiment, the width W3 of the first bank structure 311 in the first region 311c in the width direction X is less than the width W4 of the first bank structure 311 in the second region 311d in the width direction X, which facilitates patterning the bank layer 30 by using the photoetching process. Meanwhile, the first channel 312 is drilled and manufactured at a position of the first region 311c with a relatively small width of the first bank structure 311, reducing the process manufacturing difficulty.

Figure 8:
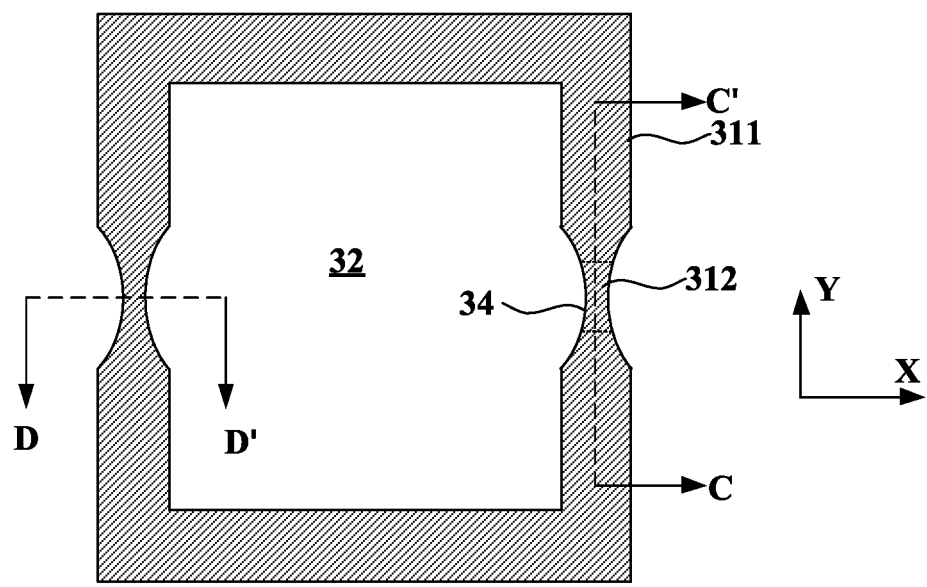
FIG. 8 is a schematic diagram of another first bank structure provided by an embodiment of the present disclosure.
Figure 9:
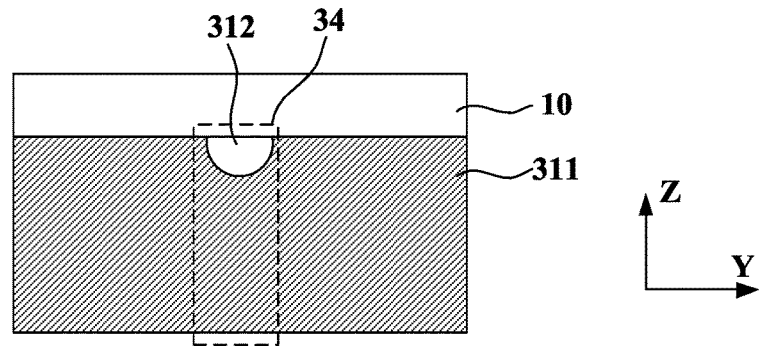
FIG. 9 is a cross-sectional view taken along the line C-C' of FIG. 8.

Referring to FIG. 8, FIG. 8 is a schematic diagram of a first bank structure provided by an embodiment of the present disclosure, and FIG. 9 is a cross-sectional view taken along the line C-C' of FIG. 8. As shown in FIGS. 8 and 9, in an embodiment, the sides of the first bank structure 311 facing the bank opening 32 are provided with recesses 34, and the first channel 312 is connected to the recesses 34. It is to be noted that the recess 34 shown in FIG. 9 may also be understood as a position of the recess. The sides of the first bank structure 311 facing the bank opening 32 are provided with the recesses 34. Apparently, the width of the first bank structure 311 at the position of the recess 34 is less than a width of the first bank structure 311 at a non-recess position, which facilitates patterning the bank layer 30 by using the photoetching process. Meanwhile, the first channel 312 which communicates two sides of the first bank structure is drilled and manufactured at the position of the recess with a relatively small width of the first bank structure 311, reducing the process manufacturing difficulty. It can be understood that a drilling under cut is an under cut under a photoresist mask.

In an embodiment, the recesses are arc-shaped. The arc-shaped recesses are formed in the sides of the first bank structure 311, which are bent in a direction facing away from the bank opening 32. The sides of the first bank structure 311 are provided with the arc-shaped recesses, which not only facilitates forming the first channel 312, but also facilitates accommodating the bubbles and impurities in the bank opening 32, and ends of the arc-shaped recesses connected to the first channel 312 are generally rounded corners, which facilitates the airflow to discharge the bubbles and impurities in the bank opening 32 through the first channel 312 which is connected to the arc-shaped recesses.

Figure 10:
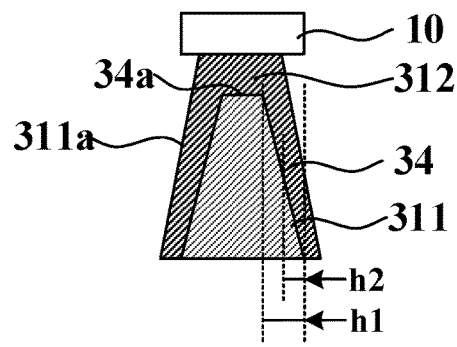
FIG. 10 is a cross-sectional view taken along the line D-D' of FIG. 8.

FIG. 10 is a cross-sectional view taken along the line D-D' of FIG. 8. As shown in FIGS. 8 and 10, in an embodiment, the first bank structure 311 includes the first end and the second end in the direction perpendicular to the first substrate 10. A depth h1 of a recess region closer to the first end of the first bank structure 311 is greater than a depth h2 of a recess region away from the first end of the first bank structure 311, and a gap is formed between an edge 34a of the recess 34 closer to the first end of the first bank structure 311 and a plane where the first end of the first bank structure 311 is located. The gap is the first channel 312. The plane where the first end of the first bank structure 311 is located is a film layer connected to the first end of the first bank structure 311.

In this embodiment, a size in a depth direction of the recess region is the depth of the recess region, the depth direction of the recess region is parallel to the width direction of the first bank structure. In an embodiment, the depth of the recess region is a maximum distance from a recess surface to the side of the first bank structure. The depth h1 of the recess region closer to the first end of the first bank structure 311 is greater than the depth h2 of the recess region away from the first end of the first bank structure 311, a width of a position closer to the first end of the first bank structure 311 is relatively small, and the first channel 312 is arranged in this area, which facilitates patterning the bank layer 30 by using the photoetching process. Meanwhile, the first channel 312 is drilled and manufactured at the position with a relatively small width of the first bank structure 311, reducing the process manufacturing difficulty.

For the display panel described in any of the above embodiments, the width of the first bank structure in the channel region is relatively small, the bank layer is photoetching patterned while the under cut may occur in the channel are to drill out the first channel in the first bank structure. That the first bank structure is formed by using the photoresist is used as an example. The bank layer is patterned. In this patterning process, different exposure doses and development conditions may be applied to the channel region of the first bank structure, or different mask pattern widths may be used for the mask plate in the channel region of the first bank structure, so that in the process of patterning the bank layer, the first channel can be directly drilled and formed in the channel region of the first bank structure without adding an additional manufacturing process of the first channel, thus reducing the process difficulty.

Figure 11:
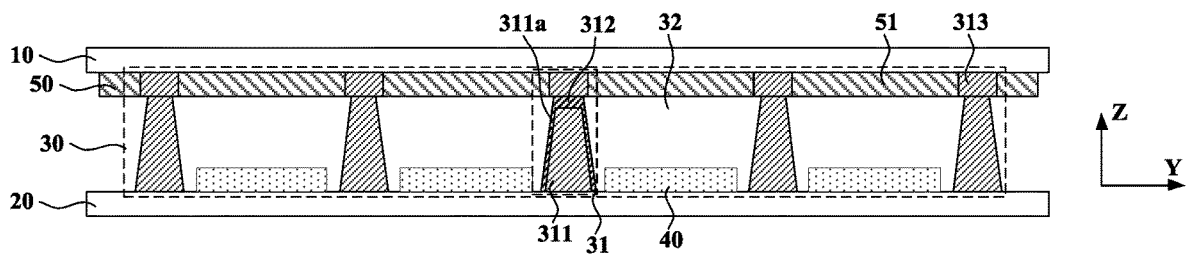
FIG. 11 is a schematic diagram of another display panel provided by an embodiment of the present disclosure.

Referring to FIG. 11, FIG. 11 is a schematic diagram of a display panel provided by an embodiment of the present disclosure. The display panel provided by this embodiment further includes: a first functional layer 50 located on a side of a first substrate 10 facing a second substrate 20. The first functional layer 50 includes a plurality of first functional modules 51 arranged at intervals, and at least part of one end of a bank structure 31 in a direction Z perpendicular to the first substrate 10 is located in an interval between two adjacent ones of the plurality of first functional modules. A first channel 312 is flush with a plane of a side of the first functional layer 50 facing the second substrate 20.

In this embodiment, at least part of the bank structure 31 is located between a plurality of first functional modules 51 arranged at intervals, the first bank structure 311 is indirectly connected to the first substrate 10 through this part of the bank structure 31. A side of this part of the bank structure 31 facing the second substrate 20 is flush with the plane of a side of the first functional layer 50 facing the second substrate 20. It can be understood that after the first substrate 10 is formed, the first functional layer 50 is formed on a side of the first substrate 10 facing the second substrate 20. After the first functional layer 50 is patterned, a plurality of first functional modules 51 arranged at intervals are formed, and then a bank layer 30 is formed on the first functional layer 50, so that a bank material is filled between the plurality of first functional modules 51 arranged at intervals.

It can be understood that bank openings 32 correspond to the first functional modules 51, and after the bank layer 30 is patterned, the bank structures 31 are formed. The bank structure 31 may be divided into a first part of bank structure located between a plurality of first functional modules 51 arranged at intervals and a second part of bank structure located between the first substrate 10 and the second substrate 20. When the bank layer 30 is patterned, the first part of bank structure located between the plurality of first functional modules 51 arranged at intervals is not under cut, and for the second part of bank structure located between the first substrate 10 and the second substrate 20 is under cut, so that the first channel 312 may be formed on a side of the first functional layer 50 facing the second substrate 20.

The bank material usually is a photoresist material. In an embodiment, the bank layer 30 is patterned by using a photoetching process. The bank layer 30 is etched by adjusting an exposure parameter or a mask pattern parameter, so that the second part of bank structure located between the first substrate 10 and the second substrate 20 is under cut to form the first channel 312. In an embodiment, the first channel 312 is flush with the plane on a side of the first functional layer 50 facing the second substrate 20, that is, the first channel 312 is located between the first part of bank structure and the second part of bank structure, which can reduce the process manufacturing difficulty without adding the new process.

The first channel 312 is flush with the plane of a side of the first functional layer 50 facing the second substrate 20, the first channel 312 is exposed by the first functional layer 50, that is, a channel boundary of the first channel 312 is flush with a surface of the first functional layer 50, but a level of a channel region of the first channel 312 exceeds a level of the first functional layer 50.

In an embodiment, in a direction Z perpendicular to the first substrate 10, the bank structure 31 further includes a second bank structure 313 located at one end of the first bank structure 311 facing the first substrate 10, the second bank structure 313 is located in the interval between two adjacent ones of the plurality of first functional modules 51, and the first channel 312 is located between the first bank structure 311 and the second bank structure 313. As shown in FIG. 11, the bank structure 31 includes the first bank structure 311 and the second bank structure 313. The first bank structure 311 is indirectly connected to the first substrate 10 through the second bank structure 313. When the bank layer 30 is patterned, the first bank structure 311 is under cut, and the first channel 312 is formed between the first bank structure 311 and the second bank structure 313. It can be understood that there is a pore between the first bank structure 311 and the second bank structure 313 in the channel region. The pore is the first channel 312 and the first bank structure 311 and the second bank structure 313 in the non-channel region are continuous and integrated.

In an embodiment, the first channel 312 is one groove. In an embodiment, the side of the first bank structure 311 in the channel region is provided with a recess, a depth of the recess gradually increases in a direction from the second substrate 20 to the first substrate 10, and the first channel 312 is connected to an edge of the recess. It can be understood that the recess may be a recess formed by a concave curved surface, or may be a recess spliced by a plurality of planes.

In an embodiment, in a direction parallel to the first substrate 10, a width of one end of the first bank structure 311 facing the first substrate 10 is 1 μm to 2 μm. In this embodiment, the width of one end of the first bank structure 311 facing the first substrate 10 is very small, so when the bank layer 30 is patterned by using a photoetching process, the first channel 312 can be directly drilled out at one end of the first bank structure 311 facing the first substrate after the first bank structure 311 is under cut, reducing the process difficulty.

Figure 12:
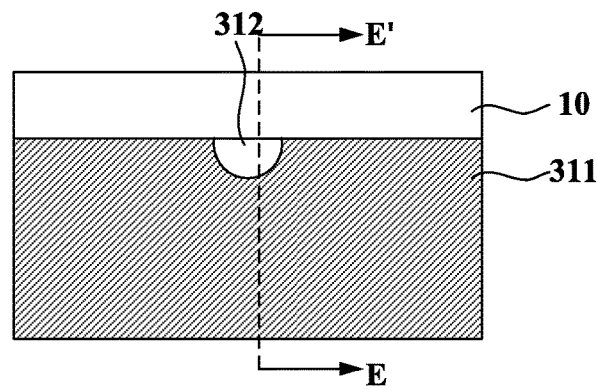
FIG. 12 is a schematic diagram of another first bank structure provided by an embodiment of the present disclosure.
Figure 13:
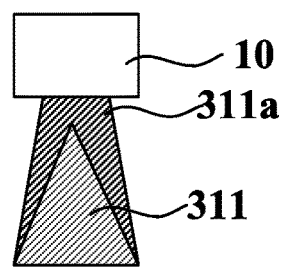
FIG. 13 is a cross-sectional view taken along the line E-E' of FIG. 12.

Referring to FIG. 12, FIG. 12 is a schematic diagram of a first bank structure provided by an embodiment of the present disclosure, and FIG. 13 is a cross-sectional view taken along A-A' of FIG. 3. As shown in FIGS. 12 and 13, in an embodiment, a cross section of a channel region of the first bank structure 311 in a direction perpendicular to the first substrate 10 is in a shape of a triangle, and the triangle includes a first vertex angle and a first edge opposite to the first vertex angle; and the first bank structure 311 includes a first end and a second end in the direction perpendicular to the first substrate 10, the first channel 312 is located at the first end of the first bank structure 311, the first vertex angle is located at the first end of the first bank structure 311, and the first edge is located at the second end of the first bank structure 311.

In this embodiment, the first end of the first bank structure 311 is one end of the first bank structure 311 facing the first substrate 10, the second end of the first bank structure 311 is one end of the first bank structure 311 facing away from the first substrate 10, and the first channel 312 is located at one end of the first bank structure 311 facing the first substrate 10. In the triangular cross section of the channel region of the first bank structure 311, the first vertex angle is one end of the first bank structure 311 facing the first substrate 10, and a first side is one end of the first bank structure 311 facing away from the first substrate 10.

When the bank layer 30 is patterned by using the photoetching process, the triangle is formed after an under cut occurs in the channel region of the first bank structure 311. When the channel region is etched to form the triangle in the photoetching process, the first channel 312 is drilled out at the first end of the first bank structure 311, ensuring the first channel to be formed in the channel region in the photoetching process and improving the process reliability.

In an embodiment, before the bank layer 30 is photoetched, it is assumed that the channel region of the first bank structure 311 is in the shape of a triangle or a sub-triangle. In an embodiment, the non-channel region of the first bank structure 311 is in a shape of a triangle or a sub-triangle. In an embodiment, a width of the non-channel region of the first bank structure 311 is greater than a width of the channel region of the first bank structure 311. When the first bank structure 311 is etched to form the triangle in the photoetching process, due to the under cut effect, a bank height of the first bank structure 311 in the channel region with a relatively small width is lowered, and the first channel 312 is naturally drilled out in the channel region of the first bank structure 311. In this way, it can be ensured that the first channel 312 is inevitably formed in the channel region of the first bank structure 311 in a case where other process parameters are uncertain.

Figure 14:
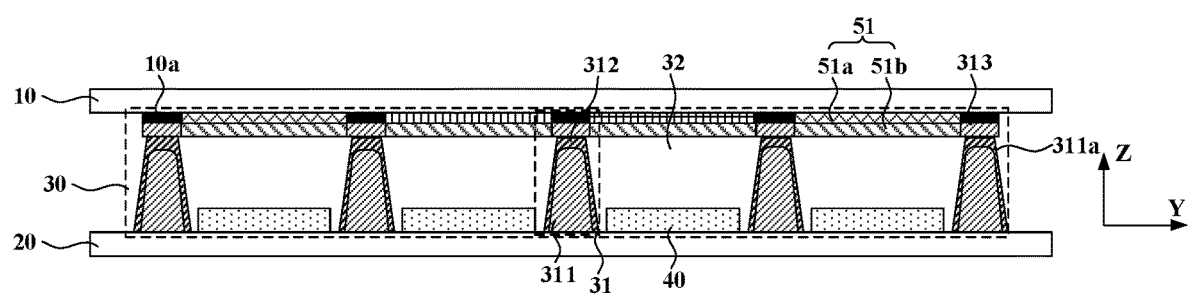
FIG. 14 is a schematic diagram of another display panel provided by an embodiment of the present disclosure.

Referring to FIG. 14, FIG. 14 is a schematic diagram of a display panel provided by an embodiment of the present disclosure. In the display panel provided in this embodiment, a black matrix 10a is located on a side of a first substrate 10 facing a second substrate 20, the black matrix 10a includes a plurality of openings, and a first functional module 51 is correspondingly arranged in the opening of the black matrix. In an embodiment, the first functional module 51 is a quantum-dot display color resist. The first functional module 51 includes at least a color resist 51a and a quantum-dot layer 51b located on a side of the color resist 51a facing the second substrate 20. In this embodiment, a first bank structure 311 may effectively support the first substrate 10 and the second substrate 20, prevent the light leakage from a light-emitting device 40, and discharge bubbles and impurities in a bank opening 32 through a first channel 312.

In addition, the first channel 312 is located between the first bank structure 311 and the second bank structure 313. The second bank structure 312 can prevent the light leakage from the light-emitting device 40 to the adjacent light-emitting device 40 to avoid exciting the adjacent quantum-dot layer 51b, and can also avoid the problem that the first channel 312 disappears after being pressed by the first substrate 10 and the second substrate 20 together. In addition, the second bank structure 312 is sandwiched between two first functional modules 51, that is, the bank structure is partially embedded in the first functional layer 50, which is equivalent to manufacturing one bank foundation in the first functional layer 50, so that the bank structure is more stable and the problem of collapse due to unstable first bank structure is avoided.

It is to be noted that the photoetching process causes a shape of an end of the first bank structure 311 at a position of the first channel 312 to be chamfered. In an embodiment, the shape of the end of the first bank structure 311 at the position of the first channel 312 is approximately a rounded trapezoid or a rounded triangle, which is equivalent to that an inlet and an outlet of the first channel 312 are relatively large, which is favorable for the bubbles in the bank opening 32 to flow and discharge. Also, the rounded bank combination is favorable for the bubbles to flow, improving the efficiency of discharging the bubbles.

In addition, each bank structure is provided with the first channel, and the first channel is located at one end of the bank structure facing away from the second substrate.

In an embodiment, the bank structure 31 includes a straight-edged region and a corner region. The first channel 312 is located in the straight-edged region of the first bank structure 311. In an extension path of the bank structure 31, the bank structure 31 includes the straight-edged region and the corner region. The corner regions of adjacent bank structures 31 are overlapped, while the straight-edged regions of the various bank structures 31 are not overlapped, and a width of the straight-edged region of the bank structure 31 is generally less than a width of the corner region of the bank structure 31. A width of the bank structure 31 is relatively large in the corner region, and if the first channel is formed in the corner region, the bank width needs to be greatly reduced, which does not facilitate shading the light. The width of the first bank structure 311 in the straight-edged region is relatively small, and if the first channel 312 is arranged in the straight-edged region, the bank width does not need to be greatly reduced, so that a good shading effect of the bank can be ensured. In addition, more light-emitting devices 40 are collected at the corner region of the bank structure 31. If the first channel is formed in the corner region, the risk of crosstalk between the adjacent light emitting devices 40 is increased after the bank width is greatly reduced.

Figure 15:
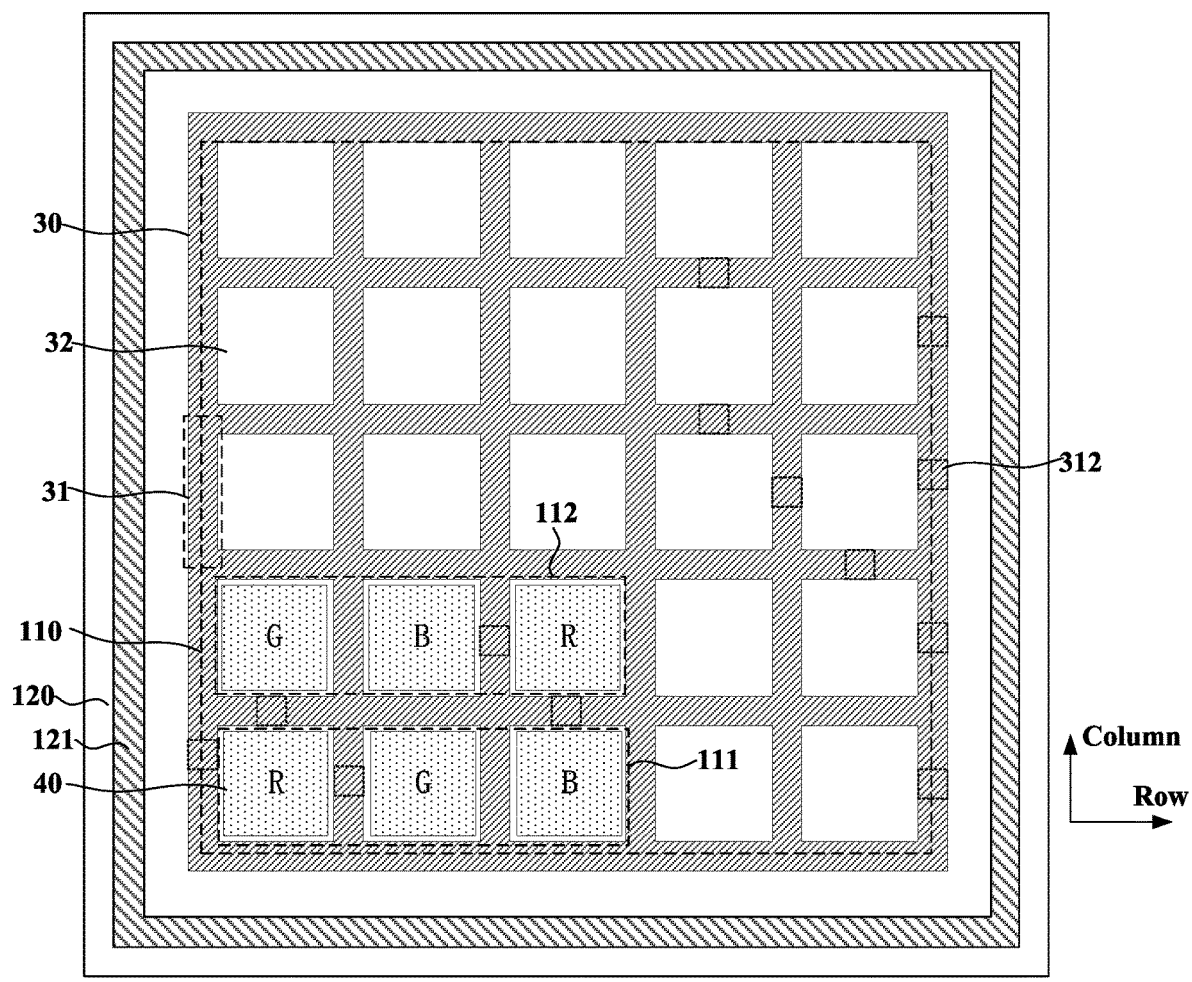
FIG. 15 is a schematic diagram of another display panel provided by an embodiment of the present disclosure.

In an embodiment, referring to FIG. 15, FIG. 15 is a schematic diagram of another display panel provided by an embodiment of the present disclosure. As shown in FIG. 15, the display panel includes a display region 110 and a non-display region 120. The non-display region 120 includes a sealant area 121 provided with a sealant, and the display region 110 includes a bank area provided with bank structures 31. At least one first channel 312 extends to an edge of a side of the bank layer 30 facing the sealant. An area covered by the bank layer 30 in the display region 110 can be understood as the bank area.

In this embodiment, a light-emitting device 40 is correspondingly arranged in a bank opening 32 of the display region 110. The non-display region 120 is located at a periphery of the display region 110, and includes a sealant area 121 provided with a sealant. The at least one first channel 312 in the bank layer 30 extends to an edge of the bank layer 30 facing the sealant, and the at least one first channel 312 may discharge impurities or bubbles in the bank openings 32 to the display region 110, improving the display effect of the display panel. It can be understood that only part of the at least one first channel 312 are shown in FIG. 15, and the at least one first channel 312 may be arranged in the bank structures 31 at a periphery of the bank openings 32, so that the bank openings 32 communicate with each other through the at least one first channel 312, and the impurities or bubbles in each of the bank openings 32 may be discharged to the display region 110 through the at least one first channels 312.

In an embodiment, the bank opening 32 communicates with at least one bank opening 32 through the first channels 312. The bubbles in the bank opening 32 may be discharged to the display region 110 through different first channels 312, improving the discharge efficiency of the impurities or bubbles in the bank opening 32. For example, in a plurality of bank structures 31 surrounding one bank opening 32, two or more bank structures 31 is provided with the first channel 312; or the bank structure 31 surrounding one bank opening 32 extends in a circumferential direction, and this circular bank structure 31 is provided with one or more first channels 312. The number and position of first channels corresponding to one bank opening are not limited in the present disclosure.

As shown in FIG. 15, in an embodiment, a plurality of light-emitting devices arranged corresponding to the plurality of bank openings include a plurality of first light-emitting devices configured to emit a first color light, a plurality of second light-emitting devices configured to emit a second color light, and a plurality of third light-emitting devices configured to emit a third color light. In an embodiment, the plurality of light-emitting devices 40 are configured to emit red light R, green light G, and blue light B, then the first light-emitting device, the second light-emitting device, and the third light-emitting device emit the red light R, the green light G, and the blue light B respectively. In other embodiments, the light-emitting devices may also be configured to emit a fourth color light, such as yellow light or the like, which is not specifically limited in the present disclosure.

As shown in FIG. 15, in an embodiment, a first bank structure located between adjacent first light-emitting device and second light-emitting device is provided with the first channel 312. The first light-emitting device is configured to emit the red light R, and the second light-emitting device is configured to emit one of the green light G or the blue light B.

In this embodiment, the first channel 312 is arranged in the bank structure 31 between the light-emitting device R and the light-emitting device G, and the first channel 312 is arranged in the bank structure 31 between the light-emitting device R and the light-emitting device B.

A display effect of color mixture of the light-emitting device G and the light-emitting device B is more obvious than a display effect of color mixture of the light-emitting device R and the light-emitting device G. The display effect of color mixture of the light-emitting device G and the light-emitting device B is more obvious than a display effect of color mixture of the light-emitting device R and the light-emitting device B. It is assumed that the first channel is arranged in the bank structure between the light-emitting device G and the light-emitting device B. If the color mixture of the light-emitting device G and the light-emitting device B occurs due to the light leakage of the first channel, the display effect may be significantly affected.

The display effect of color mixture of the light-emitting device R and the light-emitting device G is relatively weak, and the first channel 312 is arranged in the bank structure 31 between the light-emitting device R and the light-emitting device G. Even if R-G color mixture occurs due to the light leakage in the first channel 312, the color mixture has a very weak influence on the display effect, reducing the crosstalk risk.

Similarly, the display effect of color mixture of the light-emitting device R and the light-emitting device B is relatively weak, and the first channel 312 is arranged in the bank structure 31 between the light-emitting device R and the light-emitting device B. Even if R-B color mixture occurs due to the light leakage in the first channel 312, the color mixture has a very weak influence on the display effect, reducing the crosstalk risk.

Secondly, a width of the channel region of the bank structure 31 is less than a width of the non-channel region. The first channel 312 is arranged in the bank structure 31 at the periphery of the light emitting device R, which can increase an area of the bank opening 32 corresponding to the light-emitting device R, enabling a light emitting area of the light-emitting device R to be larger and improving the light-emitting efficiency of the light-emitting device R.

As shown in FIG. 15, in an embodiment, the display panel includes the display region 110 and the non-display region 120. The display region 110 includes a plurality of display modules arranged in an array, and the display modules include first display units 111 and second display units 112 arranged in a column direction. Each of the first display units 111 includes the first light-emitting device, the second light-emitting device, and the third light-emitting device sequentially arranged in a row direction; and each of the second display units 112 includes the second light-emitting device, the third light-emitting device, and the first light-emitting device sequentially arranged in a row direction.

In an embodiment, the first light-emitting device is R, the second light-emitting device is G, and the third light-emitting device is B, the first display unit 111 includes R, G, and B sequentially arranged in the row direction, and the second display unit 112 includes G, B, and R sequentially arranged in the row direction. In other embodiments, the first light-emitting device is R, the second light-emitting device is B, and the third light-emitting device is G.

Figure 16:
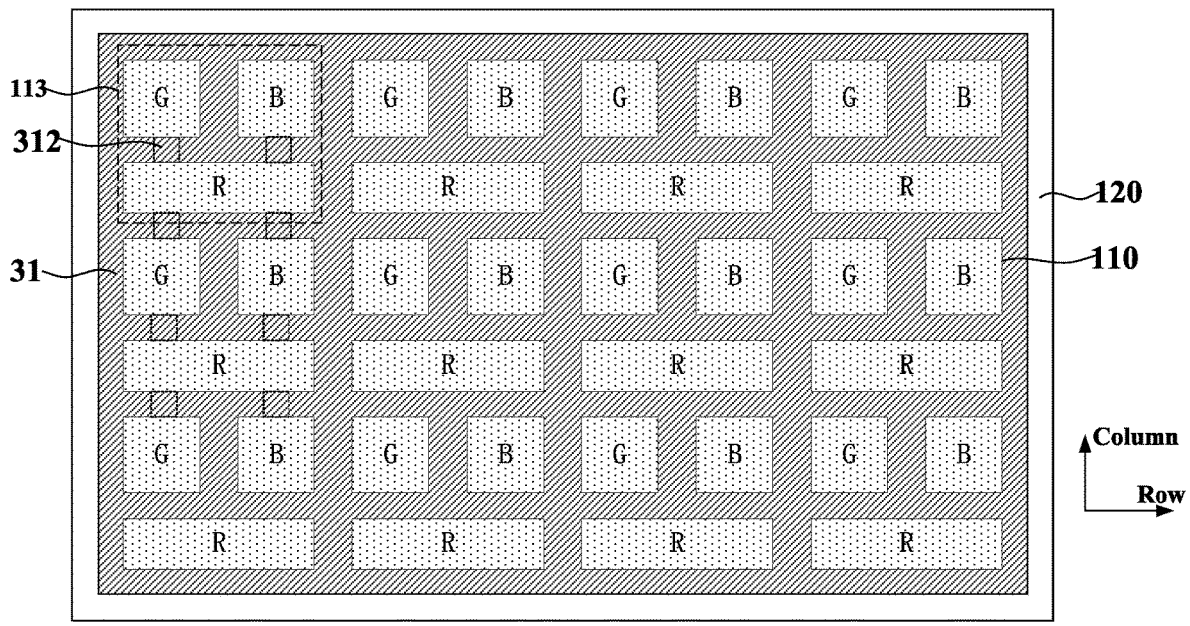
FIG. 16 is a schematic diagram of another display panel provided by an embodiment of the present disclosure.

Referring to FIG. 16, FIG. 16 is a schematic diagram of another display panel provided by an embodiment of the present disclosure. As shown in FIG. 16, in an embodiment, the display panel includes a display region 110 and a non-display region 120, the display region 110 includes a plurality of third display units 113 arranged in an array, each of the plurality of third display units 113 includes a first light-emitting device, a second light-emitting device and a third light-emitting device. In the third display unit 113, the second light-emitting device and the third light-emitting device are arranged in a row direction, and the first light-emitting device and the second light-emitting device are arranged in a column direction. In an embodiment, the first light-emitting device is R, the second light-emitting device is G, and the third light-emitting device is B, and in other embodiments, the first light-emitting device is R, the second light-emitting device is B, and the third light-emitting device is G.

In this embodiment, three light-emitting devices in the third display unit 113 are arranged in a delta shape. A first channel 312 may be arranged in a bank structure 31 between adjacent first light-emitting device and second light-emitting device, which may be located in a same third display unit 113 or in adjacent third display units 113. The first channel 312 may be arranged in the bank structure 31 between adjacent first light-emitting device and third light-emitting device, which may be located in a same third display unit 113 or in adjacent third display units 113.

A display effect of R-B color mixture is weaker than a display effect of G-B color mixture, and a display effect of R-G color mixture is weaker than a display effect of G-B color mixture. The first channel 312 is arranged in the bank structure 31 between the light-emitting device R and the light-emitting device B, and the first channel 312 is arranged in the bank structure 31 between the light-emitting device R and the light-emitting device G, so that the crosstalk phenomenon caused by the light leakage can be reduced. The area of the bank opening 32 corresponding to the light-emitting device R can also be increased, improving the light-emitting efficiency of the light-emitting device R.

Figure 17:
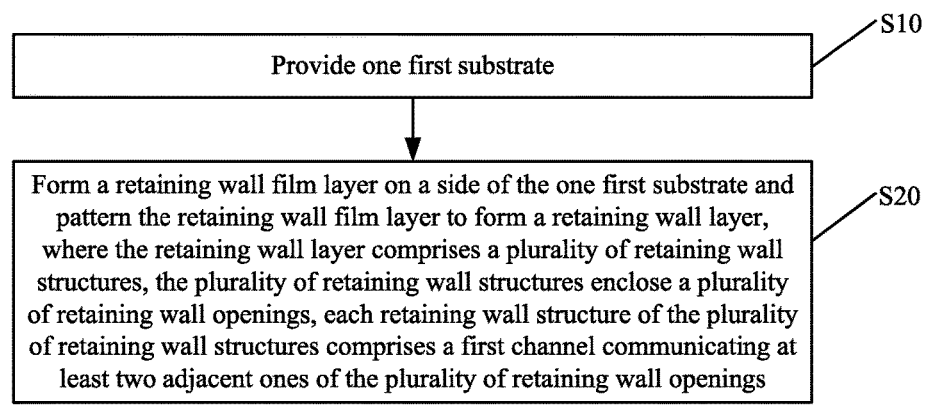
FIG. 17 is a schematic diagram of a manufacturing method of a display panel provided by an embodiment of the present disclosure.

Based on a same inventive concept, an embodiment of the present disclosure further provides a manufacturing method of a display plane. Referring to FIG. 17, FIG. 17 is a schematic diagram of a manufacturing method of a display panel provided by an embodiment of the present disclosure. As shown in FIG. 17, the manufacturing method of the display panel includes the steps described below.

In S10, one first substrate is provided.

In S20, a material layer for forming a bank film layer on a side of the first substrate is formed and the material layer is patterned to form a bank layer. The bank layer includes a plurality of bank structures, the plurality of bank structures encloses a plurality of bank openings, the plurality of bank structures includes at least one first channel communicating at least two adjacent ones of the plurality of bank openings.

In an embodiment, the operation of patterning to form the bank layer in step S20 includes a step described below. The bank film layer is patterned by using a photoetching process to form the bank layer. Usually, a photoresist is used as a bank material. Therefore, after the bank film layer is made of the photoresist material, the bank film layer may be patterned by using the photoetching process to form the bank layer. It can be understood that the photoresist material includes negative and positive, and the photoresist material with different characteristics has different photoetching process parameters, thus relevant practitioners can reasonably design the photoetching process parameters according to the characteristics of the selected photoresist material.

In an embodiment, a constituent material of the bank film layer includes the negative photoresist. A height of the bank film layer which can be formed by the negative photoresist is usually 10 to 20 microns, while a height of the bank film layer which can be formed by the positive photoresist is usually 2 to 3 microns. The negative photoresist is selected as the constituent material of the bank film layer, thus obtaining a higher bank film layer and playing a good role in blocking light.

In an embodiment, the step in which the bank film layer is patterned by using the photoetching process includes a step described below. The bank film layer is exposed through a mask plate. In a direction parallel to the first substrate, in the mask plate, a mask pattern width corresponding to a channel region is less than a mask pattern width corresponding to a non-channel region in a first bank structure.

Figure 18:
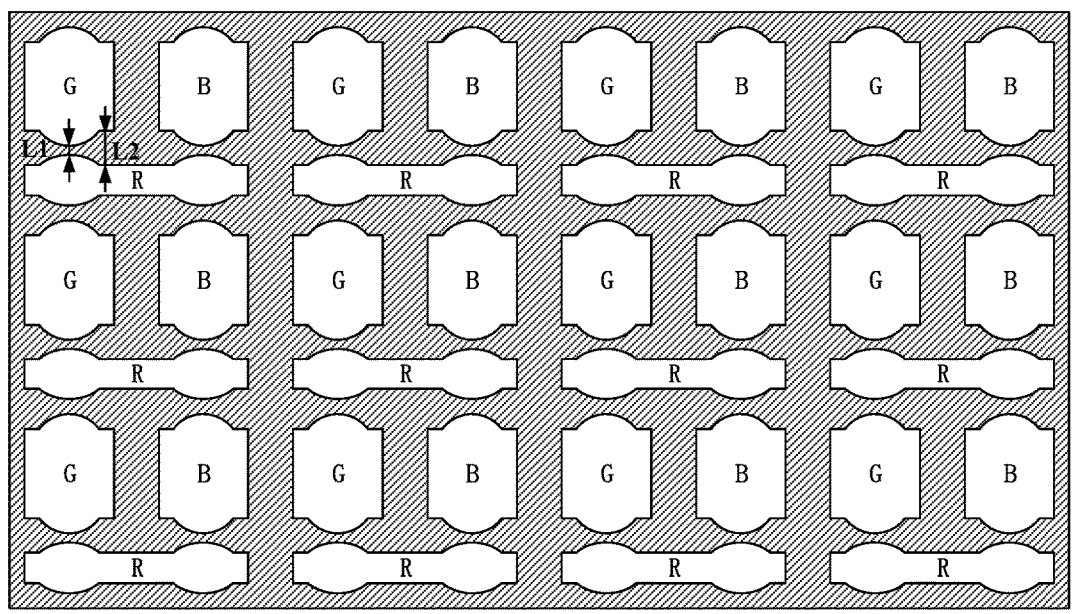
FIG. 18 is a schematic diagram of a mask plate.

Referring to FIG. 18, FIG. 18 is a schematic diagram of the mask plate 200. As shown in FIG. 18, in an embodiment, a pixel unit includes three sub-pixels which are R, G and B. The three sub-pixels are arranged in a delta shape. In an embodiment, the first channel is arranged in the bank structure 31 between R-G and R-B. In an embodiment, if the mask pattern width L1 corresponding to the channel region is less than the mask pattern width L2 corresponding to the non-channel region in the first bank structure, a width of an exposure end of the channel region in the first bank structure after exposure is less than a width of an exposure end of the non-channel region. Correspondingly, a width of a non-exposure end of the channel region in the first bank structure is smaller, and the first channel can be directly drilled out at this position by photoetching. It can be understood that FIG.

18 merely shows one pixel arrangement manner, and in other embodiments, the pattern of the mask plate varies according to different pixel arrangement manners.

In an embodiment, the step in which the bank film layer is patterned by using the photoetching process includes a step described below. The bank film layer is exposed through the mask plate. An exposure amount of a channel region in a first bank structure is different from an exposure amount of a non-channel region. In this embodiment, the exposure amount of the channel region in the first bank structure may be designed differently, so that the channel region in the first bank structure is under cut to form the first channel. Relevant practitioners may reasonably design an exposure parameter according to the product requirements, which is not specifically limited in this embodiment.

In an embodiment, after the one first substrate is provided, the method further includes a step described below. A first functional layer is formed on a side of the one first substrate facing the bank film layer. The first functional layer includes a plurality of first functional modules, the plurality of first functional modules is arranged corresponding to the plurality of bank openings, and at least part of one end of the bank structure in a direction perpendicular to the first substrate is located in an interval between two adjacent ones of the plurality of first functional modules. In an embodiment, the step of patterning to form the bank layer includes steps described below. The bank film layer is patterned by using the photoetching process. The first channel is formed in the bank structure by adjusting the exposure parameter. The first channel is flush with a surface of the first functional layer on a side facing away from the first substrate.

In this embodiment, the first functional layer is formed and patterned on a side of the first substrate facing a second substrate, so that first functional modules arranged at intervals may be formed, and the first functional modules are arranged corresponding to the bank openings. The bank film layer is formed and patterned on the first functional layer, so that the bank material is filled between adjacent first functional modules 51, and a part of the bank structure in the bank layer is filled between the adjacent first functional modules.

In an embodiment, the display panel is a quantum-dot display panel, and the first functional module is a quantum-dot display color resist, which at least includes a color resist layer and a quantum-dot layer located on a side of the color resist layer facing the second substrate. In addition, before the first functional layer is formed on the first substrate, a black matrix is formed on a side of the first substrate facing the second substrate.

When the bank film layer is patterned after the bank film layer is manufactured by using the negative photoresist material, the mask pattern width of the mask plate in the channel region is reasonably designed, in combination with the exposure amount and development condition, the under cut position is manufactured in the bank structure to form the first channel. The first channel can be formed in this method without adding the working procedure. The first channel can discharge bubbles in the bank opening in the display region, thus improving the display effect of the display panel. In addition, nitrogen may be filled into the display region through the first channel to accelerate the discharge efficiency of the bubbles or impurities in the bank opening.

What is claimed is:
1. A display panel, comprising:
a first substrate and a second substrate disposed opposite to each other; and
a bank layer located on a side of the first substrate facing the second substrate, wherein the bank layer comprises a plurality of bank structures; and the plurality of bank structures enclose a plurality of bank openings; and
a plurality of light-emitting devices, wherein each of the plurality of light-emitting devices is arranged corresponding to each bank opening of the plurality of bank openings;
wherein the plurality of bank structures comprises at least one first bank structure, and each first bank structure of the at least one first bank structure is provided with a first channel communicating at least two adjacent ones of the plurality of bank openings,
wherein a side of each first bank structure facing the bank opening is provided with a recess, and the first channel is connected to the recess, and
wherein each first bank structure comprises a first end and a second end in a direction perpendicular to the first substrate; and a depth of a recess region closer to the first end of the each first bank structure is greater than a depth of a recess region away from the first end of the each first bank structure, and a gap is formed between an edge of the recess closer to the first end of the each first bank structure and a plane where the first end of the each first bank structure is located, and the gap is the first channel.

2. The display panel of claim 1, wherein the first channel is located at least one end of each first bank structure in a direction perpendicular to the first substrate.

3. The display panel of claim 2, wherein in a direction perpendicular to the first substrate, the first channel is located at one end of each first bank structure facing the first substrate.

4. The display panel of claim 1, wherein in a direction perpendicular to the first substrate, a width of each first bank structure at a position of the first channel is less than a width of each first bank structure not at the position of the first channel.

5. The display panel of claim 1, wherein each first bank structure comprises a first region and a second region in a direction in which each first bank structure extends; and
in a direction parallel to the first substrate, a width of each first bank structure in the first region is less than a width of each first bank structure in the second region, and the first channel is located in the first region.

6. The display panel of claim 1, wherein each first bank structure comprises a first end and a second end in a direction perpendicular to the first substrate, and the first channel is located at the first end of each first bank structure; and
a width of the first end of each first bank structure is less than a width of the second end of each first bank structure in a direction parallel to the first substrate.

7. The display panel of claim 1, wherein the plurality of light-emitting devices is located on a side of the first substrate facing the second substrate, and the first channel is located at one end of each first bank structure closer to the second substrate; or
the plurality of light-emitting devices is located on a side of the second substrate facing the first substrate, and the first channel is located at one end of each first bank structure closer to the first substrate.

8. The display panel of claim 1, wherein in a direction parallel to the first substrate, a width of one end of each first bank structure facing the first substrate is 1 μm to 2 um.

9. The display panel of claim 1, wherein in a direction perpendicular to the first substrate, a maximum size of the first channel is less than or equal to 1/2 of a maximum size of each first bank structure.

10. The display panel of claim 1, wherein each of the plurality of bank structures comprises a straight-edged region and a corner region, wherein the first channel is located in the straight-edged region of each first bank structure.

11. The display panel of claim 1, wherein the display panel comprises a display region and a non-display region, wherein the non-display region comprises a sealant region provided with a sealant, and the display region comprises a bank region provided with the plurality of bank structures,
wherein at least one first channel extends to an edge of a side of the bank layer facing the sealant.

12. The display panel of claim 1, wherein each of the plurality of bank openings communicates with at least one of the plurality of bank openings through the first channel.

13. The display panel of claim 1, wherein the plurality of light-emitting devices arranged corresponding to the plurality of bank openings comprise a plurality of first light-emitting devices configured to emit a first color light, a plurality of second light-emitting devices configured to emit a second color light, and a plurality of third light-emitting devices configured to emit a third color light,
wherein each first bank structure located between the first light-emitting device and the second light-emitting device adjacent to the first light-emitting device is provided with the first channel; and
the first light-emitting device is configured to emit red light, and the second light-emitting device is configured to emit one of green light and blue light.

14. A display panel, comprising:
a first substrate and a second substrate disposed opposite to each other; and
a bank layer located on a side of the first substrate facing the second substrate, wherein the bank layer comprises a plurality of bank structures; and the plurality of bank structures enclose a plurality of bank openings; and
a plurality of light-emitting devices, wherein each of the plurality of light-emitting devices is arranged corresponding to each bank opening of the plurality of bank openings;
wherein the plurality of bank structures comprises at least one first bank structure, and each first bank structure of the at least one first bank structure is provided with a first channel communicating at least two adjacent ones of the plurality of bank openings
a first functional layer located on a side of the first substrate facing the second substrate, wherein the first functional layer comprises a plurality of first functional modules arranged at intervals, and at least part of one end of each bank structure of the plurality bank structures in a direction perpendicular to the first substrate is located in an interval between two adjacent first functional modules of the plurality of first functional modules,
wherein the first channel is flush with a plane of a side of the first functional layer facing the second substrate.

15. A display panel, comprising:
a first substrate and a second substrate disposed opposite to each other; and
a bank layer located on a side of the first substrate facing the second substrate, wherein the bank layer comprises a plurality of bank structures; and the plurality of bank structures enclose a plurality of bank openings; and
a plurality of light-emitting devices, wherein each of the plurality of light-emitting devices is arranged corresponding to each bank opening of the plurality of bank openings;
wherein the plurality of bank structures comprises at least one first bank structure, and each first bank structure of the at least one first bank structure is provided with a first channel communicating at least two adjacent ones of the plurality of bank openings, wherein a shape of a cross section of a channel region of each first bank structure in a direction perpendicular to the first substrate is a triangle, and the triangle comprises a first vertex angle and a first edge opposite to the first vertex angle; and
each first bank structure comprises a first end and a second end in the direction perpendicular to the first substrate, the first channel is located at the first end of each first bank structure, the first vertex angle is located at the first end of each first bank structure, and the first edge is located at the second end of each first bank structure.

* * * * *